United States Patent
Zilbauer et al.

(10) Patent No.: US 12,553,124 B2
(45) Date of Patent: Feb. 17, 2026

(54) SPUTTER DEPOSITION SOURCE, MAGNETRON SPUTTER CATHODE, AND METHOD OF DEPOSITING A MATERIAL ON A SUBSTRATE

(71) Applicant: Applied Materials, Inc., Santa Clara, CA (US)

(72) Inventors: Thomas Werner Zilbauer, Gauting (DE); Andreas Lopp, Freigericht (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/281,456

(22) PCT Filed: Apr. 19, 2021

(86) PCT No.: PCT/EP2021/060108
§ 371 (c)(1),
(2) Date: Sep. 11, 2023

(87) PCT Pub. No.: WO2022/223096
PCT Pub. Date: Oct. 27, 2022

(65) Prior Publication Data
US 2024/0301546 A1    Sep. 12, 2024

(51) Int. Cl.
*C23C 14/35* (2006.01)
*C23C 14/00* (2006.01)
(Continued)

(52) U.S. Cl.
CPC ........ *C23C 14/351* (2013.01); *C23C 14/0068* (2013.01); *C23C 14/3407* (2013.01);
(Continued)

(58) Field of Classification Search
CPC .............. C23C 14/351; C23C 14/0068; C23C 14/3407; C23C 14/086; C23C 14/14;
(Continued)

(56) References Cited

U.S. PATENT DOCUMENTS

2010/0193354 A1* 8/2010 Chu ................ H01J 37/3405
                                                          204/298.16
2015/0027876 A1   1/2015 Choi et al.
(Continued)

FOREIGN PATENT DOCUMENTS

CN      106460148 A    2/2017
JP      H03104864 A    5/1991
(Continued)

OTHER PUBLICATIONS

KR20120049554A Translation (Year: 2012).*
(Continued)

*Primary Examiner* — Patrick S Ott
(74) *Attorney, Agent, or Firm* — Patterson + Sheridan, LLP

(57) ABSTRACT

A sputter deposition source for depositing a material on a substrate is described. The sputter deposition source includes an array of magnetron sputter cathodes arranged in a row for coating the substrate in a deposition area on a front side of the array. At least one magnetron sputter cathode of the array includes a first rotary target rotatable around a first rotation axis (A1); and a first magnet assembly arranged in the first rotary target and configured to provide a closed plasma racetrack (P) on a surface of the first rotary target that extends along the first rotation axis (A1) on a first side and on a second side of the at least one magnetron sputter cathode. Further described is a magnetron sputter cathode for a sputter deposition source and a method of depositing a material on a substrate.

19 Claims, 6 Drawing Sheets

(51) Int. Cl.
*C23C 14/08* (2006.01)
*C23C 14/14* (2006.01)
*C23C 14/34* (2006.01)
*H01J 37/32* (2006.01)
*H01J 37/34* (2006.01)

(52) U.S. Cl.
CPC .. *H01J 37/32651* (2013.01); *H01J 37/32669* (2013.01); *H01J 37/3405* (2013.01); *H01J 37/3452* (2013.01); *C23C 14/086* (2013.01); *C23C 14/14* (2013.01); *H01J 2237/081* (2013.01); *H01J 2237/332* (2013.01)

(58) Field of Classification Search
CPC ............... C23C 14/352; C23C 14/562; H01J 37/32651; H01J 37/32669; H01J 37/3405; H01J 37/3452; H01J 2237/081; H01J 2237/332; H01J 37/3447; H01J 37/347; H01J 37/3417
See application file for complete search history.

(56) References Cited

U.S. PATENT DOCUMENTS

2018/0277343 A1* 9/2018 White .................... C23C 14/042
2022/0127745 A1* 4/2022 Chen ....................... F01D 5/286

FOREIGN PATENT DOCUMENTS

| | | | | |
|---|---|---|---|---|
| JP | 2012193459 A | 10/2012 | | |
| JP | 2013506756 A | 2/2013 | | |
| JP | 2016132806 A | 7/2016 | | |
| KR | 20120049554 A | * | 5/2012 | |
| KR | 20170018074 A | | 2/2017 | |
| TW | 201831056 A | | 8/2018 | |
| WO | WO-2015199640 A1 | * | 12/2015 | ........... C23C 14/046 |
| WO | 2020/259795 A1 | | 12/2020 | |

OTHER PUBLICATIONS

International Search Report and Written Opinion for International Application No. PCT/EP2021/060108 dated Jan. 20, 2022.
Taiwan Office Action dated Jan. 4, 2023 for Application No. 111111267.
Korean Office Action dated Jan. 31, 2025 for Application No. 10-2023-7039586.
Japanese Office Action dated Feb. 25, 2025 for Application No. 2023-563822, 6 pages.
Korean Notice of Allowance dated Oct. 27, 2025 for Application No. 10-2023-7039586.

* cited by examiner

SPUTTER DEPOSITION SOURCE, MAGNETRON SPUTTER CATHODE, AND METHOD OF DEPOSITING A MATERIAL ON A SUBSTRATE

TECHNICAL FIELD

Embodiments of the present disclosure relate to substrate coating by sputtering. Embodiments particularly relate to a sputter deposition source for coating a substrate with a material, a magnetron sputter cathode that can be used in a sputter deposition source, and a method of depositing a material on a substrate by sputtering. Embodiments described herein particularly relate to the deposition of a material by sputtering on a sensitive substrate.

BACKGROUND

Forming thin layers on a substrate with a high layer uniformity is a relevant issue in many technological fields. A process that is suitable for uniformly depositing a material on a substrate is sputtering, which has developed as a valuable method in diverse manufacturing fields, for example in the fabrication of displays. During sputtering, atoms are ejected from the surface of a sputter target by bombardment thereof with energetic particles of a plasma. The ejected atoms propagate toward the substrate and adhere thereon, so that a layer of sputtered material can be formed on the substrate.

However, sputter deposition may lead to the bombardment of the substrate with energetic particles, such as energetic plasma particles (electrons and/or ions), which may have a negative effect on the substrate. Specifically, sputter deposition utilizing an energetic plasma may have a disadvantageous influence on the properties of a top layer, particularly of a sensitive film, that may be located on the substrate. The negative influence of the sputter deposition on a sensitive substrate can be reduced by using cathodes that provide plasma confinement regions that are not directed straight toward the substrate. "Facing target sputtering (FTS)" systems with planar targets have been devised for this purpose.

In an FTS system, instead of facing the substrate directly, flat targets face each other which has the effect of a reduced bombardment of energetic particles on the substrate. However, the plasma stability in conventional FTS systems is limited, and the suitability of FTS systems for the use in mass production is impaired. Further, FTS systems are typically associated with reduced deposition rates and a low material utilization, leading to a low productivity and the risk of substrate surface contamination.

In view of the above, it would be beneficial to provide improved apparatuses and methods of depositing a material on a substrate by sputtering, particularly on substrates that are sensitive to a bombardment with energetic particles. Specifically, it would be beneficial to provide a sputter deposition source and a magnetron sputter cathode that allow the coating of sensitive substrates by sputtering with an improved material utilization and an improved deposition layer quality.

SUMMARY

In light of the above, a sputter deposition source, a magnetron sputter cathode, and methods of depositing a material on a substrate are provided according to the independent claims. Further aspects, advantages, and beneficial features are apparent from the dependent claims, the description, and the accompanying drawings.

According to one aspect, a sputter deposition source is provided. The sputter deposition source includes an array of magnetron sputter cathodes arranged in a row for coating a substrate that is arranged in a deposition area on a front side of the array. At least one magnetron sputter cathode of the array includes a first rotary target rotatable around a first rotation axis, and a first magnet assembly arranged in the first rotary target and configured to provide a closed plasma racetrack on a surface of the first rotary target, wherein the closed plasma racetrack extends along the first rotation axis on a first side and on a second side of the at least one magnetron sputter cathode different from the first side.

In some implementations, the array may include a plurality of magnetron sputter cathodes that include the above-specified features of the at least one magnetron sputter cathode, respectively. Specifically, the first sides and the second sides of the magnetron sputter cathodes may be sides that face in a longitudinal direction of the array, i.e. in directions toward the respective adjacent magnetron sputter cathodes of the array, respectively. When the plasma confinement regions are not directed toward the substrate but rather toward adjacent magnetron sputter cathodes, the risk of damage to the substrate by particle bombardment can be reduced.

According to one aspect, a magnetron sputter cathode is provided, particularly for use in any of the sputter deposition sources described herein. The magnetron sputter cathode includes a rotary target that is rotatable around a rotation axis, and a magnetron assembly that is arranged in the rotary target. The magnetron assembly includes a first magnet having a first-polarity magnet pole directed radially outwardly, and a second magnet having a second-polarity magnet pole directed radially outwardly, wherein the first magnet and the second magnet extend adjacent to each other along a closed path for generating a closed plasma racetrack on a surface of the rotary target with a first plasma confinement region extending parallel to the rotation axis on a first side of the magnetron sputter cathode and a second plasma confinement region extending parallel to the rotation axis on a second side of the magnetron sputter cathode different from the first side.

In particular, the first side and the second side of the magnetron sputter cathode may be essentially opposite sides. Specifically, the first side may face toward a first adjacent magnetron sputter cathode and the second side may face toward a second adjacent magnetron sputter cathode, and the magnetron sputter cathode and the first and second adjacent magnetron sputter cathodes may belong to an array of magnetron sputter cathodes arranged in a row.

According to one aspect, a method of depositing a material on a substrate is provided, particularly with a sputter deposition source according to any of the embodiments described herein. The method includes sputtering the material from at least one magnetron sputter cathode having a first magnet assembly arranged in a first rotary target that rotates around a first rotation axis, wherein the first magnet assembly provides a closed plasma racetrack on a surface of the first rotary target, with a first plasma confinement region extending parallel to the first rotation axis on a first side of the at least one magnetron sputter cathode and a second plasma confinement region extending parallel to the first rotation axis on a second side of the at least one magnetron sputter cathode different from the first side.

The present disclosure is to be understood as encompassing apparatuses and systems for carrying out the disclosed methods, including apparatus parts for performing each described method aspect. Method aspects may be performed for example by hardware components, by a computer programmed by appropriate software or by any combination of the two. The present disclosure is also to be understood as encompassing methods for operating described apparatuses and systems. Methods for operating the described apparatuses and systems include method aspects for carrying out every function of the respective apparatus or system. The present disclose is to be understood as encompassing products manufactured according to any of the described deposition methods. In particularly, coated substrates manufactured according to any of the methods described herein and/or using any of the sputter deposition sources described herein are provided.

BRIEF DESCRIPTION OF THE DRAWINGS

So that the features recited above can be understood in detail, a more particular description of the subject matter briefly summarized above is provided below by reference to embodiments. The accompanying drawings relate to embodiments and are described in the following.

DETAILED DESCRIPTION OF EMBODIMENTS

Reference will now be made in detail to various embodiments, wherein one or more examples of embodiments are illustrated in the figures. Within the following description of the drawings, same reference numbers refer to same components. Generally, only the differences with respect to individual embodiments are described. Each example is provided as an explanation and is not meant as a limitation. Further, features illustrated or described as part of one embodiment can be used on or in conjunction with other embodiments to yield yet a further embodiment. It is intended that the description includes such modifications and variations.

Figure 1:
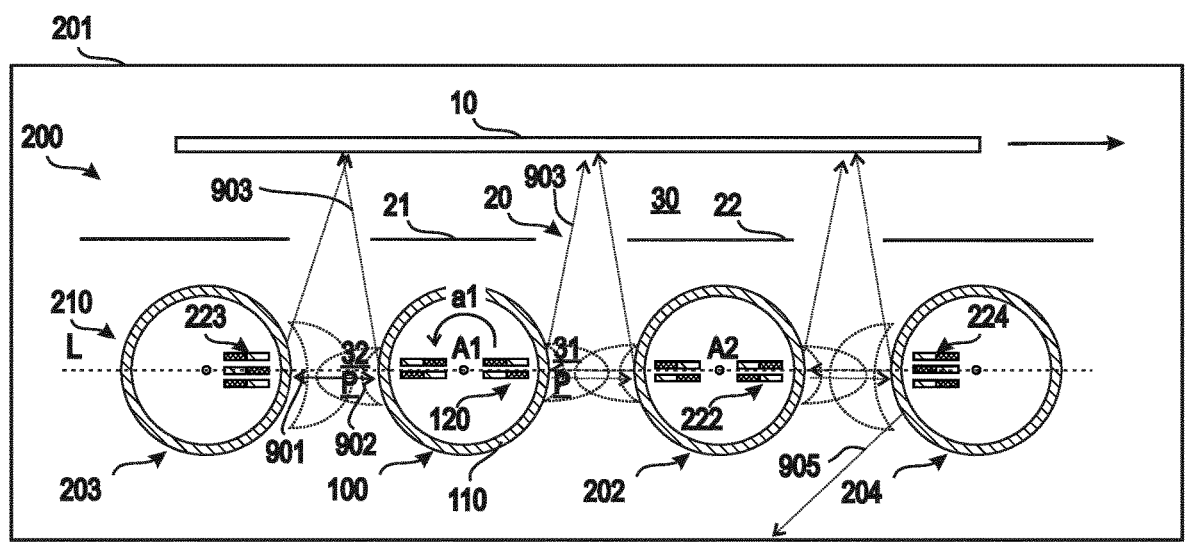
FIG. 1 is a schematic sectional view of a sputter deposition source according to embodiments described herein.

FIG. 1 shows a sputter deposition source 200 for depositing a material on a substrate according to embodiments described herein. The sputter deposition source 200 includes an array 210 of magnetron sputter cathodes arranged in a row for coating the substrate 10 that is arranged in a deposition area 30 on a front side of the array 210 of magnetron sputter cathodes. The sputter deposition source 200 may be arranged in a vacuum deposition chamber 201 of a sputter deposition system.

The sputter deposition source 200 can beneficially be used in an in-line sputter deposition system in which the substrate 10 is moved continuously past the sputter deposition source 200 through the deposition area 30 in a substrate transportation direction (e.g., from the left side to the right side in FIG. 1), particularly at an essentially constant substrate velocity ("dynamic coating"). Alternatively, the substrate may remain stationary during deposition ("static coating"). The sputter deposition source 200 can also be used in a sputter deposition system in which the substrate 10 is moved in a reciprocating manner in two opposite directions in the deposition area 30 (e.g., to the right side and to the left side in FIG. 1 in a wobbling movement), changing the movement directions several times, which is referred to herein as "substrate wobbling" or "substrate sweeping".

As used herein, a "front" or "front side" of the array 210 of magnetron sputter cathodes or of one magnetron sputter cathode refers to the side where the substrate 10 is arranged during sputter deposition thereon. An area in front of the array 210 where sputter deposition on the substrate 10 takes place is referred to herein as a deposition area 30. A "rear" or "rear side" of the array 210 of magnetron sputter cathodes or of one magnetron sputter cathode refers to the side opposite the front side, i.e. the side facing away from the substrate 10 during sputter deposition. A "lateral side" of a magnetron sputter cathode of the array may be understood as a side that faces in the longitudinal direction L of the array, for example toward an adjacent magnetron sputter cathode of the array. The array of magnetron sputter cathodes may be a linear array in which the magnetron sputter cathodes are arranged one after the other along a linear row direction, e.g. at even distances from each other, as it is schematically depicted in FIG. 1. The array of magnetron sputter cathodes may also be a curved array in which the magnetron cathodes are arranged along a curved line, e.g. in an arc-shape.

The array 210 of magnetron sputter cathodes includes a plurality of magnetron sputter cathodes, particularly three, four, five, six or more, or ten or more magnetron sputter cathodes. At least one magnetron sputter cathode 100 of the array is described in further detail below. It is to be understood that the array 210 typically includes several magnetron sputter cathodes arranged next to each other that include the features of the at least one magnetron sputter cathode 100 as described herein. The sputter deposition source 200 of FIG. 1 exemplarily shows a total of four magnetron sputter cathodes arranged in a row, wherein the inner cathodes (i.e., all but the first end cathode 203 and the second end cathode 204) are configured in accordance with the at least one magnetron sputter cathode 100. Only two inner cathodes are exemplarily depicted in FIG. 1, but more than two inner cathodes may be provided between the first end cathode 203 and the second end cathode 204.

The at least one magnetron sputter cathode 100 of the array 210 includes a first rotary target 110 rotatable around a first rotation axis A1 and a first magnet assembly 120 arranged in the first rotary target 110 and configured to provide a closed plasma racetrack P on a surface of the first rotary target 110. As mentioned above, the array 210 may include a plurality of magnetron sputter cathodes that are configured in accordance with the at least one magnetron sputter cathode 100, e.g. two, four, six, ten or more magnetron sputter cathodes arranged next to one another, particularly between two end cathodes (e.g., first end cathode 203 and second end cathode 204 depicted in FIG. 1).

A "magnetron sputter cathode" may be understood as a sputter cathode configured for magnetron sputtering that includes a magnet assembly for confining the sputter plasma in a plasma confinement region during sputtering. A magnetron sputter cathode as described herein includes a rotary target that is configured to provide the target material that is to be deposited on the substrate and that can be set on a predetermined electrical potential. The rotary target may be an essentially cylindrical target or a dog-bone target that can rotate around the rotation axis. The rotation of the rotary target around the rotation axis during sputtering ensures a more uniform sputtering of the target surface and therefore a more uniform ablation and consumption of the target material of the rotary target, such that the material utilization can be improved as compared to a planar target. Notably, a "rotary target" as used herein does not necessarily include the target material that is to be deposited on the substrate, but may be a rotatable target backing tube or rotatable target material holder on which the actual target material (which is typically a cylindrical material sleeve which is consumed during sputtering) is to be mounted. The rotary target can be set on a predetermined electrical potential for plasma ignition and maintenance and can be rotated together with the actual target material around the rotation axis.

Magnetron sputtering is particularly advantageous in that the high deposition rates can be provided, because the sputter plasma is confined by the magnet assembly in a plasma confinement region adjacent to a surface of the rotary target that is to be sputtered. The magnet assembly is positioned within the rotary target. By arranging the magnet assembly within the rotary target, i.e. inside a cylindrical target or dog-bone target, the free electrons above the target surface are forced to move within the magnetic field and cannot escape. This enhances the probability of ionizing the gas molecules typically by several orders of magnitude, such that the deposition rate can be significantly increased.

Sputtering can be used in the production of displays. In more detail, sputtering may be used for the metallization such as the generation of electrodes or buses. Sputtering is also used for the generation of thin film transistors (TFTs). It may also be used for the generation of a transparent and conductive oxide layer, e.g. of an ITO (indium tin oxide) layer. Sputtering can also be used in the production of thin-film solar cells. Generally, a thin-film solar cell comprises a back contact, an absorbing layer, and a transparent and conductive oxide layer (TCO). Typically, the back contact and the TCO layer is produced by sputtering whereas the absorbing layer is typically made in a chemical vapour deposition process. In some implementations, semiconductor substrates, such as wafers, can be coated by magnetron sputtering.

The term "substrate" as used herein shall embrace both inflexible substrates, e.g. a wafer or a glass plate, and flexible substrates, such as webs and foils, optionally including one or more layers or materials previously deposited thereon. In some embodiments, the substrate is an inflexible substrate, such as a glass plate, e.g., used in the production of solar cells. The term substrate particularly embraces a substrate which has a sensitive top layer, such as an organic material layer or an OLED layer stack or pattern on which further material is to be deposited by sputtering with a reduced risk of damaging said sensitive top layer.

A typical magnet assembly that is used for confining the sputter plasma in a predetermined region is configured to provide a closed plasma racetrack. A "closed" plasma racetrack extends along a closed path or track on a surface of the rotary target, such that the electrons of the plasma cannot escape and cannot leave the plasma racetrack at an open end of the plasma confinement region because the racetrack is closed. More specifically, the magnet assembly generates a magnetic field with magnetic field lines around which the free electrons of the plasma helically circulate while remaining in the area that is defined by the plasma racetrack because the plasma racetrack is closed. The form of the closed plasma racetrack on the target surface is defined by a closed path along which the magnets of the magnet assembly extend inside the rotary target.

A conventional magnet assembly is configured to provide a closed plasma racetrack on a single side of the magnetron sputter cathode that is typically directed directly toward the substrate. Alternatively, two separate closed plasma racetracks may be generated on two opposite sides of the magnetron sputter cathode that are directed toward two different substrates, e.g., for dual-side sputtering. Also in the latter case, each of the two separate closed plasma racetracks is arranged on only one single side of the magnetron sputter cathode. Such a magnet assembly typically includes a first magnet that is surrounded by a second magnet arranged at a close distance thereto, such that a closed plasma racetrack (a so-called "dual race track") is generated in an area in front of the magnet assembly, and is also referred to herein as a "front sputter magnet assembly". A front sputter magnet assembly can enable high deposition rates but may entail a risk that sensitive substrates are negatively affected due to a high energy input per unit area toward the substrate.

The risk of causing damage to a sensitive substrate layer can be reduced by using a "front sputter magnet assembly" arranged in a rotary target that however does not face directly toward the substrate, but that faces toward an adjacent magnetron sputter cathode. Such an arrangement may also be referred to as "Rotary Facing Target Sputtering (RFTS)". This arrangement reduces the rate of target material atoms propagating toward the substrate during sputtering. However, since the plasma racetrack generated by a front sputter magnet assembly on one single (lateral) side of the magnetron sputter cathode has a substantial angular extension around the rotation axis (such as, e.g., between 10° and 25°), the target material atoms that are knocked out from the target propagate into a wide angular range around the magnetron sputter cathode. Therefore, a considerable amount of target material accumulates on the walls of the vacuum chamber or on material shields and is therefore wasted. The material utilization and the productivity are reduced.

Embodiments described herein relate to a specific shape and design of the magnet assembly in a rotary target that overcome the above-described problems. Specifically, also sensitive substrates can be coated with a reduced risk of substrate damage, and at the same time an increased material utilization is achieved. The magnet assembly according to embodiments described herein is configured to provide a closed plasma racetrack on the surface of the rotary target, wherein the closed plasma racetrack extends along the rotation axis on a first side and on a second side of the at least one magnetron sputter cathode different from the first side. In other words, one single closed plasma racetrack is generated by the magnet assembly that extends parallel to the rotation axis on different sides of the at least one magnetron sputter cathode, particularly on two opposite sides that may optionally face in the longitudinal direction L of the array of magnetron sputter cathodes.

In particular, the single closed plasma racetrack has a first plasma confinement region 31 extending parallel to the rotation axis and facing toward a first adjacent magnetron sputter cathode on the first side of the at least one magnetron sputter cathode and a second plasma confinement region 32 extending parallel to the rotation axis and facing toward a second adjacent magnetron sputter cathode on a second side of the at least one magnetron sputter cathode opposite the first side. Such a racetrack may also be referred to as "dual side single racetrack", because a single closed racetrack extends over two different sides of the rotary target.

Referring back to FIG. 1, the first magnet assembly 120 of the at least one magnetron sputter cathode 100 is arranged inside the first rotary target 110 and is configured to provide the closed plasma racetrack P on the surface of the first rotary target 110 that extends along the first rotation axis A1 on a first side and on a second side of the at least one magnetron sputter cathode 100. Specifically, the closed plasma racetrack P includes the first plasma confinement region 31 extending parallel to the first rotation axis A1 on the first side of the at least one magnetron sputter cathode and the second plasma confinement region 32 extending parallel to the first rotation axis A1 on the second side of the at least one magnetron sputter cathode different from the first side. Accordingly, the closed plasma racetrack P is a "dual side single racetrack" as specified above.

Figure 2:
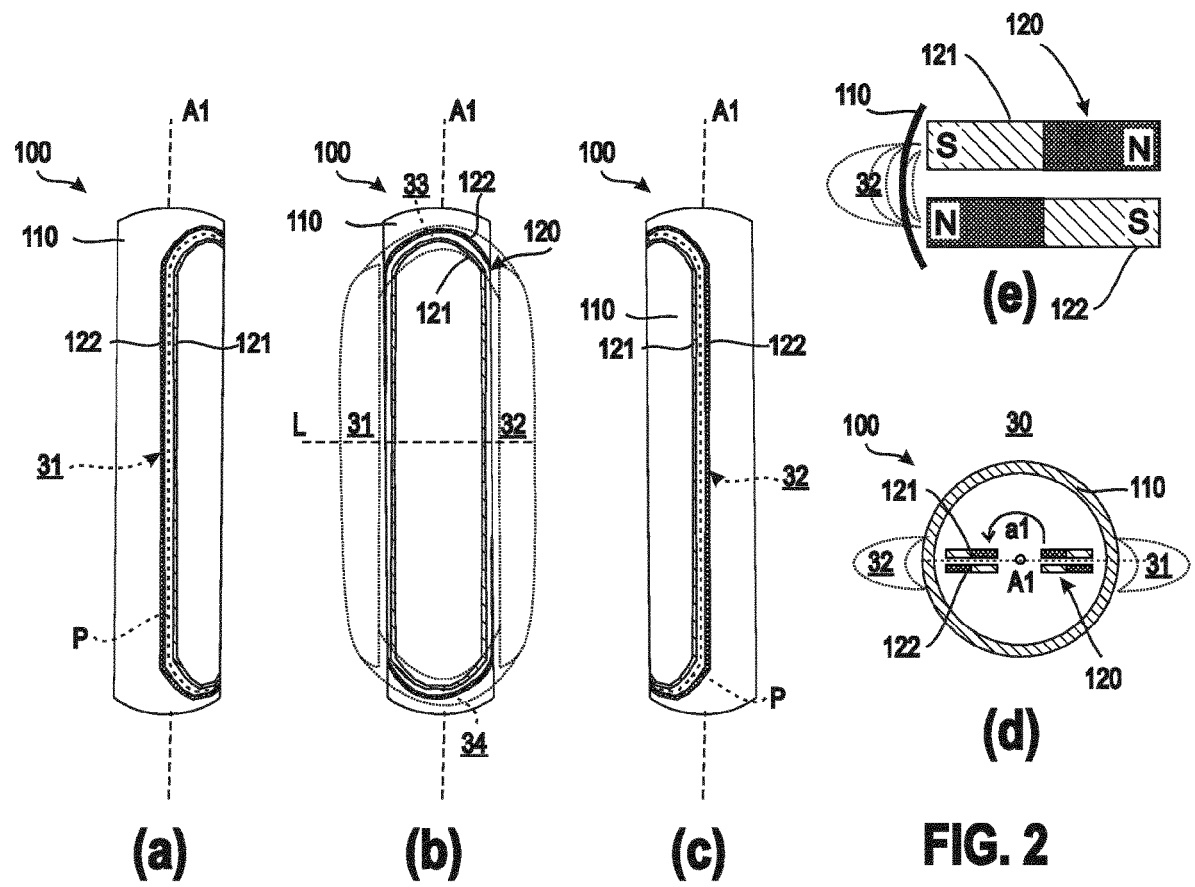
FIG. 2(a)-(d) are schematic views of a magnetron sputter cathode according to embodiments described herein, namely a first side view (a), a front view (b), a second side view (c), and a sectional view (d)
FIG. 2(e) is a schematic sectional view of the magnet assembly of the magnetron sputter cathode.

Further details of the first magnet assembly 120 are shown in FIG. 2. FIG. 2(a) is a side view of the at least one magnetron sputter cathode 100 from a first side, FIG. 2(b) is a front view of the at least one magnetron sputter cathode 100 viewed from the deposition area 30, FIG. 2(c) is a side view of the at least one magnetron sputter cathode 100 from a second side opposite the first side, and FIG. 2(d) is a sectional view of the at least one magnetron sputter cathode 100 through a center section thereof.

The at least one magnetron sputter cathode 100 includes the first rotary target 110 that is rotatable around the first rotation axis A1 and the first magnet assembly 120 that is arranged inside the first rotary target 110. The first rotary target 110 may have an essentially cylindrical shape and is configured for providing the target material that is to be deposited on the substrate. The first magnet assembly 120 is formed to generate the closed plasma racetrack P on the surface of the first rotary target 110 during sputtering, the closed plasma racetrack P extending along the first rotation axis A1 on the first side and on the second side of the at least one magnetron sputter cathode 100 different from the first side.

In particular, the first side and the second side of the at least one magnetron sputter cathode 100 face in two different directions that enclose, with respect to the first rotation axis A1, a first angle (a1) of 30° or more, particularly 90° or more, more particularly 135° or more, or even about 180°. In the latter case, the first and second sides are opposite sides of the at least one magnetron sputter cathode. Accordingly, the closed plasma racetrack P may have the first plasma confinement region 31 and the second plasma confinement region 32 on opposite sides of the at least one magnetron sputter cathode 100 in a circumferential direction.

In some embodiments, the first side and the second side of the at least one magnetron sputter cathode 100 are two opposite sides that face in a longitudinal direction L of the array 210 of magnetron sputter cathodes, respectively. Accordingly, the closed plasma racetrack P may have the first plasma confinement region 31 facing toward a first adjacent magnetron sputter cathode of the array 210 and the second plasma confinement region 32 region facing toward a second adjacent magnetron sputter cathode of the array arranged on the opposite side, as is schematically depicted in FIG. 1.

Since the first plasma confinement region 31 and the second plasma confinement region 32 of the closed plasma racetrack P are arranged on different sides of the at least one magnetron sputter cathode in the circumferential direction, a reduced amount of plasma particles (per unit area) hits the substrate, resulting in a "softer" sputtering process. If the first plasma confinement region 31 and the second plasma confinement region 32 are arranged next to the at least one magnetron sputter cathode 100 in the longitudinal direction L of the array 210, a considerable portion of the target material atoms ejected from the first rotary target 110 propagates toward an adjacent magnetron sputter cathode of the array and adheres thereon (see arrows 901, 902 in FIG. 1). The target material atoms that adhere on an adjacent magnetron sputter cathode can be ejected later from the adjacent magnetron sputter cathode toward the substrate and are not lost or otherwise wasted. A portion of the ejected target material atoms will propagate toward the substrate 10 (see arrows 903 in FIG. 1), forming a layer thereon with a potentially reduced deposition rate ("stray coating"). Since the plasma is not directed directly toward the substrate, a risk of damaging the substrate by charged plasma particles is reduced.

Further, since the closed plasma racetrack P extends on two different sides of the at least one magnetron sputter cathode 100 along the first rotation axis A1, the angular extension of each of the first plasma confinement region 31 and the second plasma confinement region 32 is comparatively small (namely a "single" racetrack extending over different target sides as compared to a "dual" racetrack on a single target side), such that stray coating into unwanted directions, such as toward the rear side of the array, can be reduced. It is schematically depicted in FIG. 1 that the plasma confinement region generated by a "front sputter magnet assembly" that faces into a lateral direction has a broader angular extension, facilitating stray coating into unwanted directions (see arrow 905 in FIG. 1).

A magnetron sputter cathode of the array 210 arranged adjacent to the at least one magnetron sputter cathode 100 is also referred to herein as a second magnetron sputter cathode 202 and is depicted in FIG. 1 on the right side of the at least one magnetron sputter cathode 100. The second magnetron sputter cathode 202 includes a second rotary target rotatable around a second rotation axis A2, and a second magnet assembly 222 arranged in the second rotary target and configured to provide a closed plasma racetrack on a surface of the second rotary target, wherein the closed plasma racetrack extends along the second rotation axis A2 on a first side and on a second side of the second magnetron sputter cathode 202. Specifically, the second magnet assembly 222 may be configured in accordance with the first magnet assembly 120 (apart from an optional inversion of the magnet poles that is depicted in FIG. 1).

As is depicted in FIG. 1, the first side of the at least one magnetron sputter cathode 100 may face toward the second magnetron sputter cathode 202, and the second side of the second magnetron sputter cathode 202 may face toward the at least one magnetron sputter cathode 100. Such an arrangement provides the beneficial effect that many of the target material atoms ejected from the rotary targets propagate toward the respective adjacent magnetron sputter cathode and adhere thereon, and are therefore not wasted. Further, the plasma is not directed directly toward the substrate but is rather focused in an area between adjacent magnetron sputter cathodes.

As is depicted in detail in FIG. 2(d) and FIG. 2(e), the first magnet assembly 120 may include a first magnet 121 having a first-polarity magnet pole (e.g., a south pole that is illustrated with a first hatching type in the figures) directed radially outwardly, and a second magnet 122 having a second-polarity magnet pole (e.g., a north pole that is illustrated with a second hatching type in the figures) directed radially outwardly. The first magnet 121 and the second magnet 122 extend adjacent to each other along a closed path inside the first rotary target 110 for generating the closed plasma racetrack P on the surface of the first rotary target 110.

In other words, both the first magnet 121 and the second magnet 122 extend along said closed path within the first rotary target 110, the first magnet 121 having the first-polarity magnet pole directed radially outwardly and the second magnet 122 having the second-polarity magnet pole directed radially outwardly along said path. The first magnet 121 and the second magnet 122 extend next to each other along the closed path, e.g. with an essentially constant spacing therebetween, such that an essentially uniform plasma confinement region is provided along the closed path.

FIG. 2(e) is a sectional view of the first magnet assembly 120 in a sectional plane perpendicular to the extension of the closed path. The south pole of the first magnet 121 is directed radially outwardly (i.e. toward the first rotary target 110), and the north pole of the second magnet 122 is directed radially outwardly (i.e. toward the first rotary target 110) adjacent thereto, such that a plasma confinement region (here: second plasma confinement region 32) is generated by the resulting magnetic field lines on the surface of the first rotary target 110.

As is depicted in detail in FIG. 2(b), the closed path may include two linear track sections that respectively extend parallel to the first rotation axis A1. Along each of said linear track sections, the first magnet 121 and the second magnet 122 face outwardly into a respective radial direction for providing the first plasma confinement region 31 and the second plasma confinement region 32 on different sides of the first rotary target. The two linear track sections may extend in the axial direction over 60% or more, particularly over 70% or more of the axial dimension of the first rotary target 110, such that target material of a major part of the surface of the first rotary target is sputtered by the generated plasma. The closed path may further include two curved track sections that connect the two linear track sections on the two opposite axial ends of the at least one magnetron sputter cathode 100.

In some embodiments, the first magnet assembly 120 is configured to provide the closed plasma racetrack P that includes the first plasma confinement region 31 extending parallel to the first rotation axis A1 on the first side of the at least one magnetron sputter cathode, the second plasma confinement region 32 extending parallel to the first rotation axis A1 on the second side of the at least one magnetron sputter cathode different from the first side, a first curved plasma confinement region 33 that connects the first and second plasma confinement regions at a first axial end portion of the at least one magnetron sputter cathode, and a second curved plasma confinement region 34 that connects the first and second plasma confinement regions at a second axial end portion of the at least one magnetron sputter cathode.

In embodiments, which can be combined with other embodiments described herein, the axial direction of the at least one magnetron sputter cathode 100 (and the axial direction of the other magnetron sputter cathodes of the array) may be an essentially vertical direction. Accordingly, the first curved plasma confinement region 33 may connect the first plasma confinement region 31 and the second plasma confinement region 32 at an upper end of the at least one magnetron sputter cathode, and the second curved plasma confinement region 34 may connect the first plasma confinement region 31 and the second plasma confinement region 32 at a lower end of the at least one magnetron sputter cathode. In a front view, as depicted in FIG. 2(b), the closed path of the first magnet assembly 120 and therefore the closed plasma racetrack P that is provided by the first magnet assembly may have essentially the shape of a racing track with two straights that are spaced apart from each other in the longitudinal direction L of the array and that are connected by two curves at the two axial ends of the rotary target.

In some implementations, the first curved plasma confinement region 33 and the second curved plasma confinement region 34 may both extend on the front side of the array. Specifically, the plasma racetrack may be closed both at an upper end of the at least one magnetron sputter cathode and at a lower end of the at least one magnetron sputter cathode at the front side that is directed toward the deposition area 30. The sputter deposition rate on the substrate from the two axial end portions of the at least one magnetron sputter cathode can be increased with such a configuration of the first magnet assembly 120 because the plasma racetrack is directed toward the substrate at the two axial end portions of the first rotary target 110. In some embodiments, an increased deposition rate on substrate areas corresponding to the axial end portions of the at least one magnetron sputter cathode (e.g., on an upper and a lower substrate edge region) may be beneficial.

In other embodiments, the first curved plasma confinement region 33 and the second curved plasma confinement region 34 may both extend on a rear side of the array opposite the front side. Specifically, the plasma racetrack may be closed both at an upper end of the at least one magnetron sputter cathode and at a lower end of the at least one magnetron sputter cathode at the rear side that is directed away from the substrate during sputter deposition. The sputter deposition rate on substrate areas corresponding to the two axial end portions of the magnetron sputter cathode can be reduced with such a configuration of the first magnet assembly 120. In some embodiments, a reduced deposition rate on substrate areas corresponding to the axial end portions of the at least one magnetron sputter cathode (e.g., on an upper and a lower substrate edge region) may be beneficial.

As is further shown in FIG. 1, the array 210 may include a first end cathode 203 provided at a first end of the array 210 in the longitudinal direction L and/or a second end cathode 204 provided at a second end of the array 210 in the longitudinal direction L. The first end cathode 203 and/or the second end cathode 204 may include a magnet assembly that is different from the magnet assemblies of the inner magnetron sputter cathodes of the array, in order to prevent or reduce a stray coating toward walls of the vacuum deposition chamber 201 at the ends of the array 210.

In particular, the first end cathode 203 may include a third magnet assembly 223 configured for generating a closed plasma racetrack that extends on a single side of the first end cathode 203, particularly wherein the closed plasma racetrack faces toward the remaining magnetron sputter cathodes of the array 210. In implementations, the third magnet assembly 223 may include a first magnet having a first-polarity magnet pole directed radially outwardly and a second magnet having a second-polarity magnet pole directed radially outwardly that surrounds the first magnet, generating a closed plasma racetrack. In the sectional view of FIG. 1, the second magnet is arranged on two opposite sides of the centrally arranged first magnet. The third magnet assembly 223 may correspond to a front sputter magnet assembly that is however directed in a lateral direction toward an adjacent magnetron sputter cathode and not toward the deposition area 30.

Alternatively or additionally, the second end cathode 204 may include a fourth magnet assembly 224 configured for generating a closed plasma racetrack that extends on a single side of the second end cathode 204, particularly wherein the closed plasma racetrack faces toward the remaining magnetron sputter cathodes of the array 210. The fourth magnet assembly 224 may include a first magnet having a first-polarity magnet pole directed radially outwardly and a second magnet having a second-polarity magnet pole directed radially outwardly that surrounds the first magnet on the single side of the second end cathode. In the sectional view of FIG. 1, the second magnet is arranged on two opposite sides of the centrally arranged first magnet. The fourth magnet assembly 224 may correspond to a front sputter magnet assembly that is however directed in a lateral direction toward an adjacent magnetron sputter cathode and not toward the deposition area 30.

In some embodiments, a plurality of four, six or more magnetron sputter cathodes with some or all the features of the at least one magnetron sputter cathode 100 are arranged between the first end cathode 203 and the second end cathode 204. In particular, each of the magnetron sputter cathodes arranged between the first and second end cathodes may have a magnet assembly configured to provide a closed plasma racetrack having two plasma confinement regions extending in an axial direction on two opposite sides in the longitudinal direction L of the respective magnetron sputter cathode.

In some embodiments, which can be combined with other embodiments described herein, a first shield 21 is positioned between the at least one magnetron sputter cathode 100 and the deposition area 30, and/or a second shield 22 is positioned between the second magnetron sputter cathode 202 and the deposition area 30, such that a deposition window 20 is arranged between the first shield 21 and the second shield 22. The deposition window enables a sputter deposition on the substrate 10 from the plasma confinement region that is arranged between the at least one cathode 100 and the second magnetron sputter cathode 202. In particular, each of the magnetron sputter cathodes of the array 210 may have a respective shield arranged between the magnetron sputter cathode and the deposition area 30, such that a plurality of deposition windows are provided at positions corresponding to the regions between the magnetron sputter cathodes, respectively.

Figure 3:
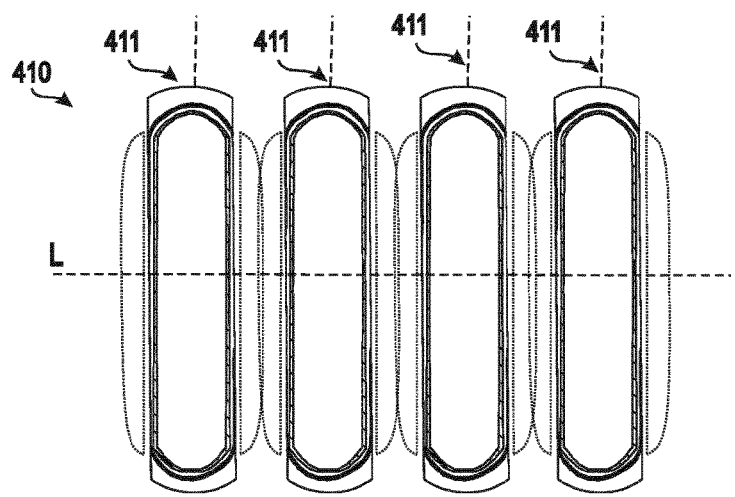
FIG. 3 is a schematic front view of a sputter deposition source according to embodiments described herein.

FIG. 3 shows a sputter deposition source with an array 410 of magnetron sputter cathodes arranged in a row in a front view. The array 410 includes a plurality of magnetron sputter cathodes 411 that are configured in accordance with the at least one magnetron sputter cathode 100 shown in FIG. 2. Each magnetron sputter cathode includes a magnet assembly configured for generating a closed plasma racetrack that extends in the respective axial direction on two opposite sides of the respective magnetron sputter cathode.

The first and second plasma confinement regions are directed toward the respective adjacent magnetron sputter cathodes. The two curved plasma confinement regions at the axial ends of each cathode are respectively arranged on the same side of the array, particularly on the front side of the array that faces toward the deposition area (or alternatively on the rear side of the array that faces away from the deposition area). The array 410 of magnetron sputter cathodes shown in FIG. 3 allows the deposition of material on a substrate with a reasonably high deposition rate at a reduced energy input by charged particles into the substrate, reducing the risk of damage to a sensitive substrate surface. Optionally, one or two end cathodes as described herein may be added on the two opposite ends of the array 410 (not shown in FIG. 3).

Figure 4:
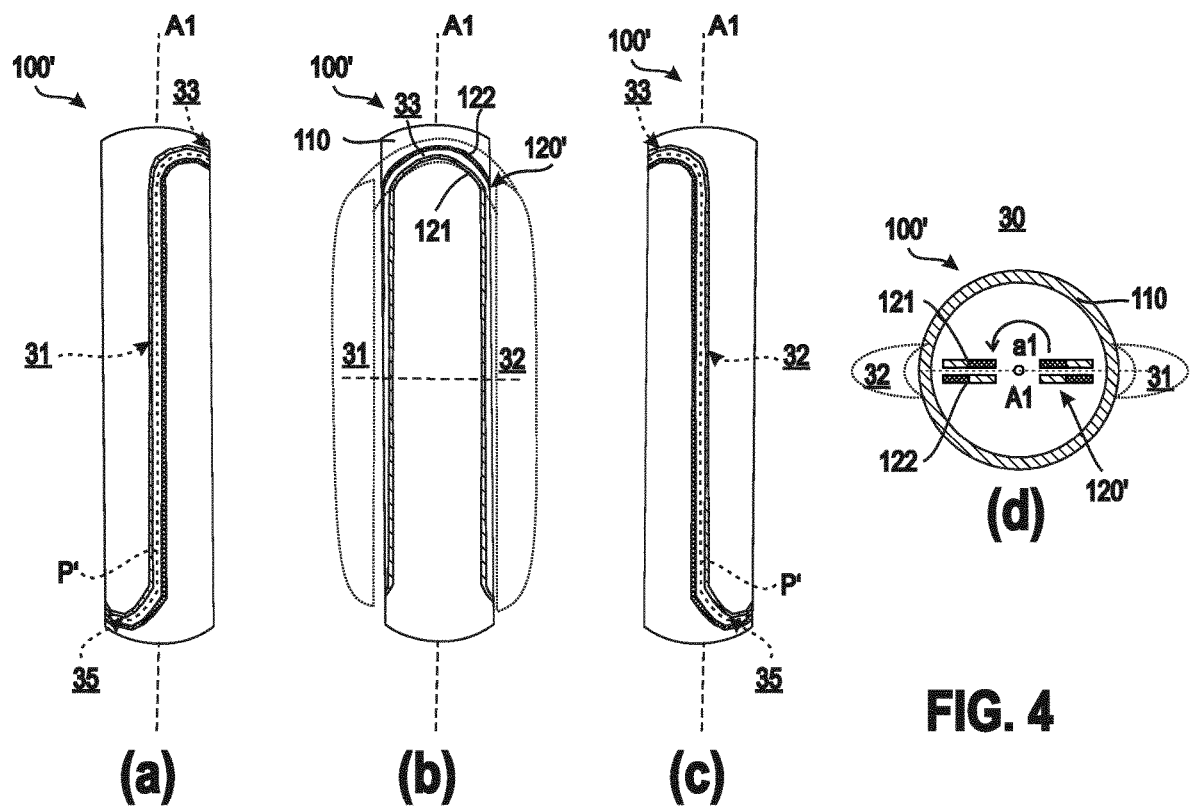
FIG. 4(a)-(d) are schematic views of a magnetron sputter cathode according to embodiments described herein, namely a first side view (a), a front view (b), a second side view (c), and a sectional view (d)

FIG. 4(*a*)-(*d*) are schematic views of a magnetron sputter cathode 100' according to embodiments described herein that may replace the at least one magnetron sputter cathode 100 shown in FIG. 2 in any of the embodiments described herein. FIG. 4(*a*) is a first side view, FIG. 4(*b*) is a front view, FIG. 4(*c*) is a second side view, and FIG. 4(*d*) is a sectional view of a center section of the magnetron sputter cathode 100'. The magnetron sputter cathode 100' is similar to the at least one magnetron sputter cathode 100 described above, such that reference can be made to the above explanations, which are not repeated here. Only the differences will be described.

The magnetron sputter cathode 100' includes a first rotary target 110 rotatable around a first rotation axis A1 and a first magnet assembly 120' arranged in the first rotary target 110. The first magnet assembly 120' includes a first magnet 121 having a first-polarity magnet pole (for example a south pole) directed radially outwardly, and a second magnet 122 having a second-polarity magnet pole (for example a north pole) directed radially outwardly. The first magnet 121 and the second magnet 122 extend adjacent to each other along a closed path for generating a closed plasma racetrack P' on a surface of the first rotary target with a first plasma confinement region 31 extending parallel to the first rotation axis on a first side of the magnetron sputter cathode 100' and a second plasma confinement region 32 extending parallel to the first rotation axis A1 on a second side of the magnetron sputter cathode different from the first side (for example on an opposite side).

A first curved plasma confinement region 33 connects the first plasma confinement region 31 and the second plasma confinement region 32 on a first axial end portion of the magnetron sputter cathode, and a second curved plasma confinement region 35 connects the first plasma confinement region 31 and the second plasma confinement region 32 at a second axial end portion of the magnetron sputter cathode. Different from the at least one magnetron sputter cathode 100 of FIG. 2, the first curved plasma confinement region 33 may extend on the front side of the array (or alternatively on a rear side of the array) and the second curved plasma confinement region 35 may extend on a rear side of the array (or alternatively on the front side of the array). Accordingly, the closed plasma racetrack P' is directed toward the deposition area 30 at one of the axial ends of the magnetron sputter cathode and is directed away from the deposition area 30 at the other axial end of the magnetron sputter cathode. For example, the first curved plasma confinement region 33 may connect the first and second plasma confinement regions at an upper end of the magnetron sputter cathode on the front side of the array, and the second curved plasma confinement region 35 may connect the first and second plasma confinement regions at a lower end of the magnetron sputter cathode on the rear side of the array, or vice versa.

Figure 5:
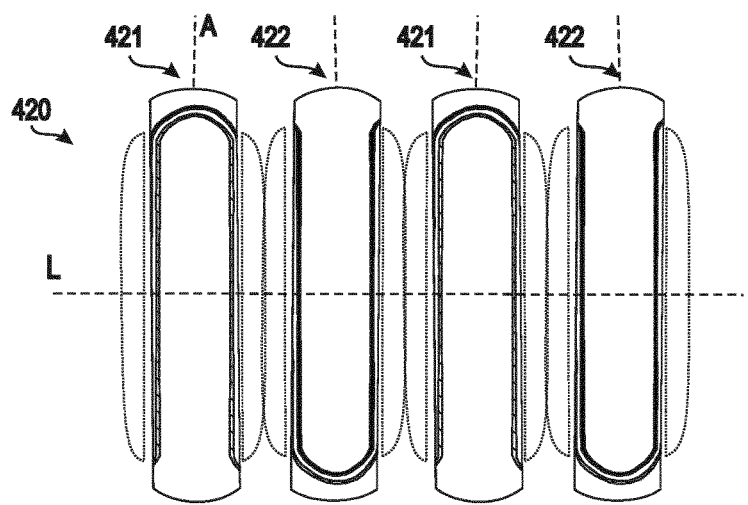
FIG. 5 is a schematic front view of a sputter deposition source according to embodiments described herein.

Specifically, the closed plasma racetrack P' may "turn around" at opposing sides of the magnetron sputter cathode 100'. The sides of the magnetron sputter cathode where the closed plasma racetrack turns around may be different for two adjacent magnetron sputter cathodes of the array, as it is schematically depicted in FIG. 5. In particular, the closed plasma racetrack of at least one magnetron sputter cathode may include the first curved plasma confinement region at an upper axial end portion that extends on the front side of the array and the second curved plasma confinement region at a lower axial end portion that extends on the rear side of the array, whereas the closed plasma racetrack of a second magnetron sputter cathode adjacent to the at least one magnetron sputter cathode may include the first curved plasma confinement region at an upper axial end portion that extends on the rear side of the array and the second curved plasma confinement region at a lower axial end portion that extends on the front side of the array. Optionally, further magnetron sputter cathodes that are configured in accordance with the at least one sputter cathode and the second sputter cathodes may be arranged next to each other in an alternating arrangement, as is schematically depicted in FIG. 5.

FIG. 5 shows a sputter deposition source with an array 420 of magnetron sputter cathodes arranged in a row in a front view. The array 420 includes a plurality of magnetron sputter cathodes that are configured in accordance with the magnetron sputter cathode 100' shown in FIG. 4, wherein adjacent magnetron sputter cathodes of the array have invertedly arranged magnet assemblies (i.e. the magnet assemblies of adjacent magnetron sputter cathodes are turned relative to each other by 180° around the rotation axis), such that an alternating array of magnetron sputter cathodes is provided. Every second magnetron sputter cathode 421 has the first curved plasma confinement region (which is arranged at the upper cathode end) extending on the front side of the array and the second curved plasma confinement region (which is arranged at the lower cathode end) extending on the rear side of the array. Magnetron sputter cathodes 422 arranged respectively therebetween have the first curved plasma confinement regions (which are arranged at the upper cathode ends) extending on the rear side of the array and the second curved plasma confinement regions (which are arranged at the lower cathode ends) extending on the front side of the array. Such an alternating arrangement of magnetron sputter cathodes can provide a sputter deposition layer having more uniform upper and lower end portions, because potential non-uniformities caused by differences between upper and lower curved plasma confinement regions are compensated.

As explained above, end cathodes (not shown in FIG. 5) as described herein may optionally be arranged at one or both ends of the array 420.

Figure 6A:
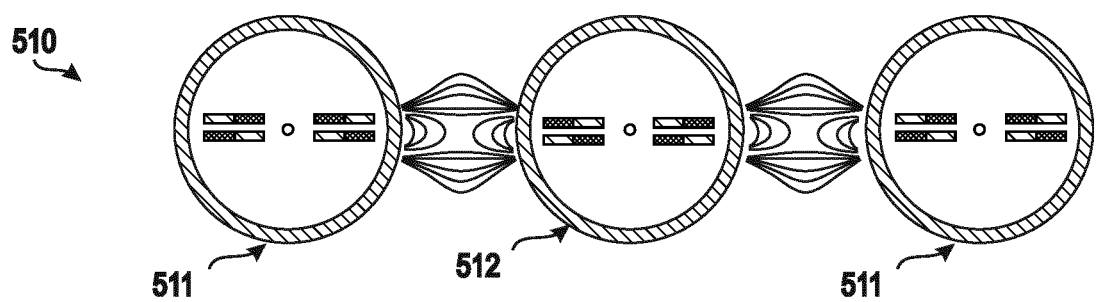
FIG. 6A, 6B are schematic sectional views of sputter deposition sources according to embodiments described herein.
Figure 6B:
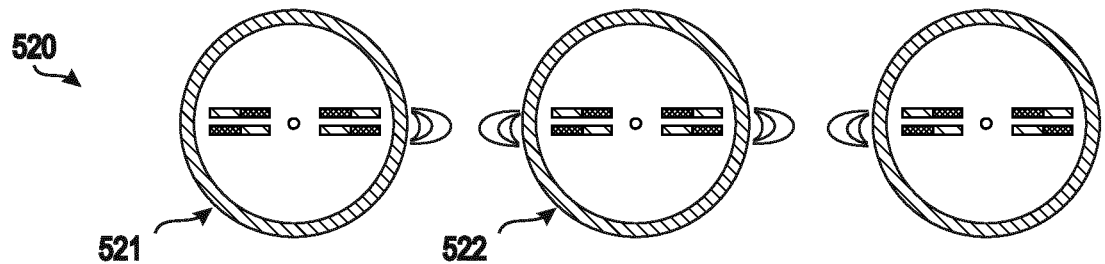

FIG. 6A and FIG. 6B are schematic sectional views of sputter deposition sources according to embodiments described herein. In the sputter deposition source 510 of FIG. 6A, the magnet assemblies of two adjacent magnetron sputter cathodes are arranged "asymmetrically" with respect to each other. In the sputter deposition source 520 of FIG. 6B, the magnet assemblies of two adjacent magnetron sputter cathodes are arranged "symmetrically" with respect to each other.

Referring first to FIG. 6A, the first and second magnets of the first magnet assembly of at least one magnetron sputter cathode 511 face toward first and second magnets of the second magnet assembly of a second magnetron sputter cathode 512 arranged adjacent to the at least one magnetron sputter cathode 511 and are arranged asymmetrically with respect to the first and second magnets of the second magnet assembly. "Arranged asymmetrically" may be understood in that a first-polarity magnet pole of the first magnet of the first magnet assembly is directed toward a second-polarity magnet pole of the first magnet of the second magnet assembly of the adjacent magnetron sputter cathode, and that a second-polarity magnet pole of the second magnet of the first magnet assembly is directed toward a first-polarity magnet pole of the second magnet of the second magnet assembly of the adjacent magnetron sputter cathode. If opposite poles of the magnet assemblies of adjacent magnetron sputter cathodes are directed toward each other, a larger plasma confinement region is generated between the magnetron sputter cathodes, or even one continuous plasma confinement region extending between the adjacent magnetron sputter cathodes. This results in a magnetic lens effect that supports charged particle divergence away from the substrate and may be beneficial for the sputter deposition on sensitive substrates.

Several pairs of adjacent magnetron sputter cathodes of the array may have magnet assemblies arranged asymmetrically relative to each other, respectively, as is schematically depicted in FIG. 6A.

Referring now to FIG. 6B, the first and second magnets of the first magnet assembly of the at least one magnetron sputter cathode 521 face toward first and second magnets of the second magnet assembly of a second magnetron sputter cathode 522 arranged adjacent to the at least one magnetron sputter cathode 521 and are arranged symmetrically with respect to the first and second magnets of the second magnet assembly. "Arranged symmetrically" may be understood in that a first-polarity magnet pole of the first magnet of the first magnet assembly is directed toward a first-polarity magnet pole of the first magnet of the second magnet assembly of the adjacent magnetron sputter cathode, and that a second-polarity magnet pole of the second magnet of the first magnet assembly is directed toward a second-polarity magnet pole of the second magnet of the second magnet assembly of the adjacent magnetron sputter cathode. If same poles of the magnet assemblies of adjacent magnetron sputter cathodes are directed toward each other, a smaller plasma confinement region is generated between the adjacent magnetron sputter cathodes, which may be useful for decreasing the sputter deposition rate and/or for further reducing the energy input into the substrate.

Several pairs of adjacent magnetron sputter cathodes of the array may have magnet assemblies arranged symmetrically relative to one another, respectively, as is schematically depicted in FIG. 6B.

Figure 7:
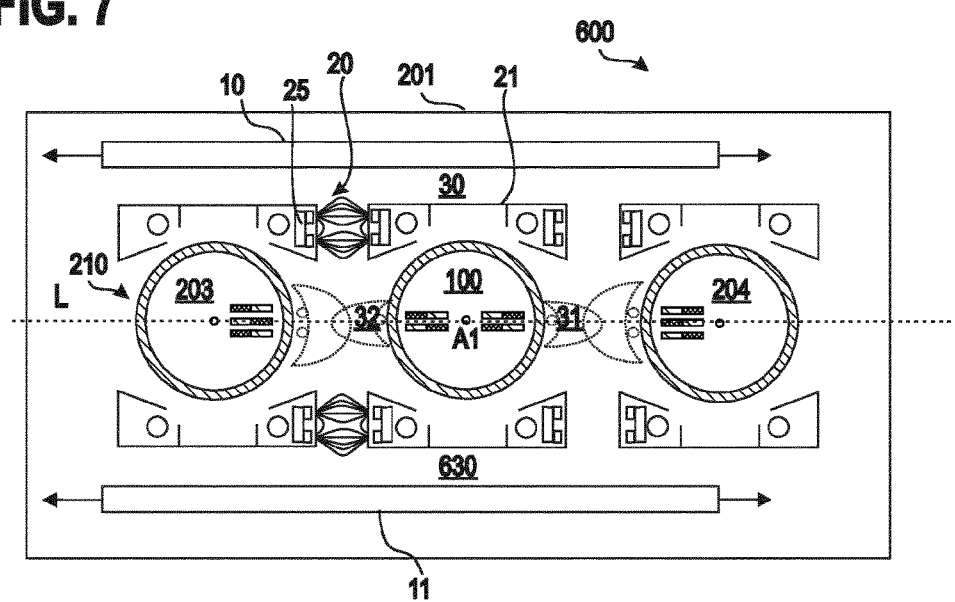
FIG. 7 is a schematic sectional view of a sputter deposition source according to embodiments described herein.

FIG. 7 is a schematic sectional view of a sputter deposition source 600 according to embodiments described herein that is configured for use in a two-side sputter system which allows the simultaneous or subsequent coating of two substrates on opposite sides of the sputter deposition source 600. The sputter deposition source 600 may be configured in accordance with any of the embodiments described herein.

The sputter deposition source 600 is arranged in a vacuum deposition chamber 201. The deposition area 30 for coating the substrate 10 is arranged on a front side of the sputter deposition source 600 and a second deposition area 630 for coating a second substrate 11 is arranged on the rear side of the sputter deposition source 600 opposite the first side. A substrate transport track may extend through each of the two deposition areas.

At least one magnetron sputter cathode 100 or several magnetron sputter cathodes of the array 210 of magnetron sputter cathodes include a magnet assembly configured for generating a closed "dual side single racetrack" as described herein. The "dual side single racetrack" of the at least one magnetron sputter cathode 100 includes a first plasma confinement region 31 directed toward a first adjacent magnetron sputter cathode and a second plasma confinement region 32 directed toward a second adjacent magnetron sputter cathode. Therefore, target material atoms ejected from the rotary target by the plasma particles may propagate both toward the deposition area 30 where the substrate 10 is arranged and toward the second deposition area 630 where the second substrate 11 is arranged. The material utilization can be further increased because a reduced amount of target material atoms accumulates on the walls of the vacuum deposition chamber 201 or on other material shields.

In some embodiments, which can be combined with other embodiments described herein, at least one magnetic lens 25 may be provided in an area between the sputter deposition source and the deposition area. The at least one magnetic lens 25 may be configured to divert charged particles (such as electrons or ions of the plasma) away from the substrate, which may further soften the sputter deposition on the substrate. In some embodiments, a plurality of magnetic lenses may be provided, for example acting in the areas of the deposition windows 20 which may be provided between shields arranged between the magnetron sputter cathodes and the deposition area, respectively.

Figure 8:
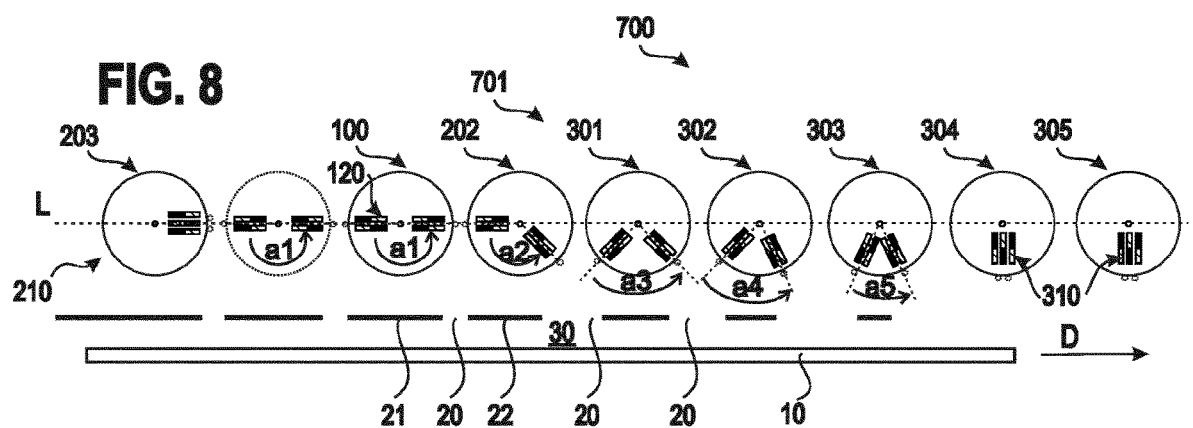
FIG. 8 is a schematic sectional view of a sputter deposition source according to embodiments described herein.

FIG. 8 is a schematic sectional view of a sputter deposition source 701 according to embodiments described herein, wherein the sputter deposition source 701 is configured for use in an in-line deposition system 700 in which the substrate 10 is transported past the sputter deposition source 701 in a downstream direction D during sputter deposition, particularly in a continuous linear movement.

The sputter deposition source 701 includes an array 210 of magnetron sputter cathodes arranged in a row that extends in a longitudinal direction L. The array 210 includes at least one magnetron sputter cathode 100 as described herein, including a first magnet assembly 120 configured for generating a closed plasma racetrack that extends on the first side and on the second side of the at least one magnetron sputter cathode 100. The first side and the second side of the at least one magnetron sputter cathode face in two different directions that enclose, with respect to the first rotation axis A1, a first angle a1. The first angle a1 may be 160° or more, particularly about 180°. In particular, the first side and the second side face in the longitudinal direction L toward the two adjacent magnetron sputter cathodes, such that the bombardment of the substrate with energetic particles from the plasma is considerably reduced during sputter deposition. Optionally, several magnetron sputter cathodes with magnet assemblies that are directed in the longitudinal direction L of the array may be provided in an initial section of the array 210, as is schematically depicted in FIG. 8. Accordingly, a negative effect of the sputter deposition on a sensitive substrate layer can be reduced.

Once an initial sputter deposition layer is formed on the sensitive substrate by the magnetron sputter cathodes arranged in the initial section of the array 210, the magnets of magnet assemblies of subsequent cathodes can be inclined further toward the substrate because the initial sputter deposition layer can act as a protective film for the subsequently deposited part of the sputter deposition layer. An inclination of the magnet assemblies toward the substrate increases the sputter deposition rate, but also the bombardment of the substrate with energetic and potentially harmful plasma particles.

A second magnetron sputter cathode 202 may be arranged adjacent to the at least one magnetron sputter cathode 100 in the downstream direction D. The first side and the second side of the closed plasma racetrack of the second magnetron sputter cathode 202 may enclose a second angle a2 that is smaller than the first angle a1. Specifically, the magnets of the second magnet assembly of the second magnetron sputter cathode 202 may be inclined toward the substrate as compared to the magnets of the first magnet assembly of the at least one magnetron sputter cathode 100. For example, the second angle a2 is smaller than 180°, e.g., between 120° and 150°. The second magnetron sputter cathode 202 provides an increased deposition rate and an increased particle bombardment on the substrate as compared to the at least one magnetron sputter cathode 100, which may be acceptable because an initial sputter film acting as a protection has already been deposited on the sensitive layer of the substrate. Optionally, several second magnetron sputter cathodes 202 having the second angle a2 between the first and second sides may be arranged next to each other downstream of the at least one magnetron sputter cathode 100.

Optionally, a third magnetron sputter cathode 301 may be arranged downstream of the second sputter cathode 202 in the downstream direction D. The first side and the second side of the closed plasma racetrack of the third magnetron sputter cathode 301 may enclose a third angle a3 that is smaller than the first and second angles a1 and a2. Specifically, the magnets of the third magnet assembly of the third magnetron sputter cathode 301 may be inclined further toward the substrate as compared to the magnets of the second magnet assembly of the second magnetron sputter cathode 202. For example, the third angle a3 may be smaller than 120°, e.g., between 70° and 110°. The third magnetron sputter cathode 301 provides an increased deposition rate and an increased particle bombardment on the substrate as compared to the second magnetron sputter cathode 202, which may be acceptable because a sputter film has already been deposited on the sensitive layer of the substrate by the previous magnetron sputter cathodes of the array. Optionally, several third magnetron sputter cathodes 301 having the third angle a3 between the first and second sides may be arranged next to each other downstream of the second magnetron sputter cathode 202.

Optionally, further magnetron sputter cathodes having magnet assemblies whose magnets are further inclined toward the substrate may be provided downstream of the third magnetron sputter cathode 301, e.g. at least one fourth magnetron sputter cathode 302 enclosing a fourth angle a4 (smaller than the third angle a3) between the first and second sides, and at least one fifth magnetron sputter cathode 303 enclosing a fifth angle a5 (smaller than the fourth angle a4) between the first and second sides. The sputter deposition rate can be increased in a stepwise manner in the downstream direction D because the sputter deposition layer acts as a protection for the sensitive substrate layer at a position downstream of the initial section of the array.

In some embodiments, which can be combined with other embodiments described herein, the array 210 further includes at least one front sputter cathode 304 arranged downstream of the second magnetron sputter cathode 202 (and downstream of optional third, fourth and fifth magnetron sputter cathodes). The front sputter cathode 304 includes a front sputter magnet assembly 310 that is configured to provide a closed plasma racetrack that extends on a single side of the front sputter cathode that faces toward the deposition area 30. Several front sputter cathodes, e.g. front sputter cathode 304 and front sputter cathode 305, may be arranged at a final section of the array 210 in the downstream direction. A front sputter cathode 304 provides a high deposition rate which may be acceptable because a protective layer is already formed on the sensitive substrate layer.

In some embodiments, which can be combined with other embodiments described herein, the magnet assembly of at least one magnetron sputter cathode may be movable for adjusting the angle between the first side and the second side. In particular, the first angle a1 between the linear track sections of the magnet assembly can be adjusted, for example with an actuator, in particular in a range between 50° and 180°. This allows an adaption of the magnetron sputter cathode to the sensitivity of the substrate to be coated, to the deposition material that is to be deposited on the substrate, and/or to the sputter deposition process. In other embodiments, the position and arrangement of the magnet assemblies inside the rotary targets may be fixed.

In some embodiments, a plurality of shields, including the first shield 21 and the second shield 22, are positioned between the array 210 and the deposition area 30, wherein the deposition windows 20 that are provided between two adjacent shields become gradually larger in the downstream direction D. Specifically, the distances between adjacent shields are adapted to the respective inclination angles of the magnet assemblies of the associated magnetron sputter cathodes. No shields may be arranged between the front sputter cathodes and the deposition area 30.

In some embodiments, which can be combined with other embodiments described herein, a width and/or a shape of a deposition window 20 between two adjacent shields can be adjusted. Hence, the deposition windows 20 can be adjusted to the inclination angles of the magnet assemblies of the associated magnetron sputter cathodes. This allows an adaption of the sputter deposition source to substrates with various sensitivity levels.

Figure 9:
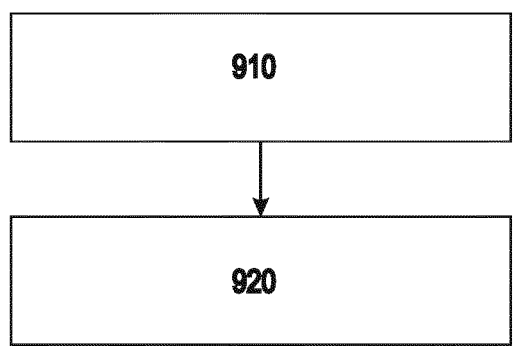
FIG. 9 is a flow diagram that illustrates a method of depositing a material on a substrate according to embodiments described herein.

FIG. 9 is a flow diagram that illustrates a method of depositing a material on a substrate according to embodiments described herein.

In box 910, the material is sputtered from at least one magnetron sputter cathode having a first magnet assembly arranged in a first rotary target that rotates around a first rotation axis. The first magnet assembly provides a closed plasma racetrack on a surface of the first rotary target with a first plasma confinement region extending parallel to the first rotation axis on a first side of the first magnetron sputter cathode and a second plasma confinement region extending parallel to the first rotation axis on a second side of the first magnetron sputter cathode different from the first side. The at least one magnetron sputter cathode may optionally be an inner magnetron sputter cathode of an array of magnetron sputter cathodes arranged in a row.

The first side and the second side may be two opposite sides of the at least one magnetron sputter cathode, the first side facing toward a first adjacent magnetron sputter cathode and the second side facing toward a second adjacent magnetron sputter cathode of the array.

In box 920, the substrate is moved past the sputter deposition source in a continuous linear movement for coating the substrate with the material. For example, the substrate may be coated in an in-line deposition system in which the substrate is moved past the sputter deposition source in a downstream direction D. The sputter deposition source may have several magnetron sputter cathodes arranged next to each other in the downstream direction D. The first side and the second side of the at least one magnetron sputter cathode may face in two different directions that enclose, with respect to the first rotation axis, a first angle a1. For example, the first angle may be about 180°.

Optionally, a second magnetron sputter cathode may be arranged at a downstream position relative to the at least one magnetron sputter cathode. The first side and the second side of the second magnetron sputter cathode may face in two different directions that enclose, with respect to the second rotation axis of the second magnetron sputter cathode, a second angle a2 smaller than the first angle.

Optionally, a third magnetron sputter cathode may be arranged at a downstream position relative to the second magnetron sputter cathode. The first side and the second side of the third magnetron sputter cathode may face in two different directions that enclose, with respect to the third rotation axis of the third magnetron sputter cathode, a third angle smaller than the first and second angles.

Optionally, a front sputter cathode may be arranged at a downstream position relative to the second (and optionally third) magnetron sputter cathode. The front sputter cathode is configured to provide a closed plasma racetrack that extends on a single side of the front sputter cathode that faces toward the deposition area.

In an alternative process, the substrate may be moved in the deposition area in a reciprocating manner, e.g. between two turnaround positions, particularly in a wobbling or sweeping movement. In such a sputter deposition system, a plurality of magnetron sputter cathodes configured in accordance with the at least one magnetron sputter cathode described herein may be arranged next to each other, and particularly between two end cathodes. The first and second plasma confinement regions may be arranged between two adjacent magnetron sputter cathodes, respectively, as is shown in FIG. 1, in order to obtain a "soft" sputter deposition on the substrate.

In some embodiments, the material deposited on the substrate forms a transparent conductive oxide film. For example, the material deposited on the substrate may include at least one of IZO, ITO, and IGZO. In some embodiments, the material includes a metal such as Ag.

The substrate may include a sensitive layer or pattern, particularly including an organic or OLED material, that is to be coated with the sputter deposition source described herein.

The sputter deposition source may be configured for DC sputtering. In some embodiments, the sputter deposition source may be configured for pulsed DC sputtering.

In embodiments, the sputter deposition source may be configured for sputtering of a transparent conductive oxide film. The system may be configured for deposition of materials like indium tin oxide (ITO), indium zinc oxide (IZO), indium gallium zinc oxide (IGZO) or MoN. In embodiments, the system may be configured for deposition of metallic material like silver, magnesium silver (MgAg), aluminum, indium, indium tin (InSn), indium zinc (InZn), gallium, gallium zinc (GaZn), niobium, alkali metals (like Li or Na), alkaline earth metals (like Mg or Ca), yttrium, lanthanum, lanthanides (like Ce, Nd, or Dy) and alloys of those materials. In embodiments, the system may be configured for deposition of metal oxide materials such as $AlO_x$, $NbO_x$, $SiO_x$, $WO_x$, $ZrO_x$. The sputter deposition source may be configured for the deposition of electrodes, particularly transparent electrodes in displays, particularly OLED displays, liquid crystal displays, and touchscreens. More particularly, the system may be configured for deposition of top contacts for top-emitting OLEDs. In embodiments, the system may be configured for deposition of electrodes, particularly transparent electrodes in thin film solar cells, photodiodes, and smart or switchable glass. The system may be configured for sputtering transparent dielectrics used as charge generation layers. The system may be configured for deposition of materials like molybdenum oxide (MoO), or transition metal oxides like vanadium oxide (VO) or tungsten oxide (WOx), zirconium oxide (ZrO) or lanthanum oxide (LaO). The system may be configured for sputtering transparent dielectrics used for optical enhancement layers like silicon oxide (SiO), niobium oxide (NbO), titanium oxide (TiO), or tantalum oxide (TaO).

In embodiments, a target material of a rotary target can be selected from the group consisting of silver, aluminum, silicon, tantalum, molybdenum, niobium, titanium and copper. Particularly, the target material can be selected from the group consisting of IZO, ITO, silver, IGZO, aluminum, silicon, NbO, titanium, zirconium, and tungsten. The sputter deposition source may be configured to deposit the material via a reactive sputter process. In reactive sputter processes, typically oxides of the target materials are deposited. However, nitrides or oxy-nitrides might be deposited as well.

Embodiments described herein can be utilized for Display PVD, i.e. sputter deposition on large area substrates for the display market. According to some embodiments, large area substrates or respective carriers, wherein the carriers have a plurality of substrates, may have a size of at least 0.67 $m^2$. Typically, the size can be about 0.67 $m^2$ (0.73 m×0.92 m—Gen 4.5) to about 8 $m^2$, more typically about 2 $m^2$ to about 9 $m^2$ or even up to 12 $m^2$. Typically, the substrates or carriers, for which the structures, apparatuses, such as cathode assemblies, and methods according to embodiments described herein are provided, are large area substrates as described herein.

The feature that the closed plasma racetracks face toward adjacent magnetron sputter cathodes provides the advantage that a "soft" sputter deposition is achieved. For example, bombardment of the substrate with high energy particles is reduced. Damage of the substrate, particularly of an OLED coating on the substrate, may be mitigated. This is particularly advantageous with respect to the deposition on sensitive substrates or layers, more particularly deposition on substrates having a sensitive coating. The feature of the "dual side single racetrack" that is generated by the magnet assemblies described herein reduces the bombardment of the substrate with high energy particles and at the same time increases the material utilization because the portion of the target material atoms that adhere on the vacuum chamber walls and on other material shield can be reduced.

While the foregoing is directed to some embodiments, other and further embodiments may be devised without departing from the basic scope of the disclosure. The scope is determined by the following claims.

The invention claimed is:

1. A sputter deposition source, comprising an array of magnetron sputter cathodes arranged in a row for coating a substrate in a deposition area on a front side of the array, wherein at least one magnetron sputter cathode of the array comprises:
   a first rotary target rotatable around a first rotation axis; and
   a first magnet assembly arranged in the first rotary target and configured to provide a closed plasma racetrack on a surface of the first rotary target, the closed plasma racetrack extending along the first rotation axis on a first side and on a second side of the at least one magnetron sputter cathode, and the closed plasma racetrack comprising:
   a first plasma confinement region extending parallel to the first rotation axis on the first side of the at least one magnetron sputter cathode;
   a second plasma confinement region extending parallel to the first rotation axis on the second side of the at least one magnetron sputter cathode opposite to the first side, so that the first plasma confinement region and the second plasma confinement region are on opposite sides of the at least one magnetron sputter cathode and face in two different directions that enclose, with respect to the first rotation axis, a first angle of 180°;
   a first curved plasma confinement region that connects the first plasma confinement region and the second plasma confinement region at a first axial end portion of the at least one magnetron sputter cathode; and
   a second curved plasma confinement region that connects the first plasma confinement region and the second plasma confinement region at a second axial end portion of the at least one magnetron sputter cathode.

2. The sputter deposition source of claim 1, wherein the first side and the second side of the at least one magnetron sputter cathode are two opposite sides that face in a longitudinal direction of the array.

3. The sputter deposition source of claim 1, wherein the first magnet assembly comprises:
   a first magnet having a first-polarity magnet pole directed radially outwardly; and
   a second magnet having a second-polarity magnet pole directed radially outwardly,
   wherein the first magnet and the second magnet extend adjacent to each other along a closed path for generating the closed plasma racetrack on the surface of the first rotary target.

4. The sputter deposition source of claim 1, wherein the first curved plasma confinement region extends on the front side of the array and the second curved plasma confinement region extends on a rear side of the array, or vice versa.

5. The sputter deposition source of claim 1, wherein the first curved plasma confinement region and the second curved plasma confinement region both extend on the front side of the array; or
   wherein the first curved plasma confinement region and the second curved plasma confinement region both extend on a rear side of the array opposite the front side.

6. The sputter deposition source of claim 1, wherein a second magnetron sputter cathode of the array that is arranged adjacent to the at least one magnetron sputter cathode comprises:
   a second rotary target rotatable around a second rotation axis; and
   a second magnet assembly arranged in the second rotary target and configured to provide a closed plasma racetrack on a surface of the second rotary target, wherein the closed plasma racetrack extends along the second rotation axis on a first side and on a second side of the second magnetron sputter cathode.

7. The sputter deposition source of claim 6, wherein the first side of the at least one magnetron sputter cathode faces toward the second magnetron sputter cathode, and the second side of the second magnetron sputter cathode faces toward the at least one magnetron sputter cathode.

8. The sputter deposition source of claim 6, wherein the first curved plasma confinement region is at an upper axial end portion that extends on the front side of the array and the second curved plasma confinement region is at a lower axial end portion that extends on a rear side of the array, and wherein the closed plasma racetrack of the second magnetron sputter cathode comprises a first curved plasma confinement region at an upper axial end portion that extends on the rear side of the array and a second curved plasma confinement region at a lower axial end portion that extends on the front side of the array; and the array optionally comprising further magnetron sputter cathodes corresponding to the at least one magnetron sputter cathode and the second magnetron sputter cathode in an alternating arrangement.

9. The sputter deposition source of claim 6, wherein the sputter deposition source is configured for an in-line deposition system, wherein the first side and the second side of the second magnetron sputter cathode face in two different directions that enclose, with respect to the second rotation axis, a second angle smaller than a first angle.

10. The sputter deposition source of claim 9, wherein the second magnetron sputter cathode is arranged adjacent to the at least one magnetron sputter cathode in a downstream direction of the in-line deposition system, the array further comprising at least one front sputter cathode arranged in the downstream direction from the second magnetron sputter cathode and comprising:

a front sputter magnet assembly configured to provide a closed plasma racetrack that extends on a single side of the front sputter cathode that faces toward the deposition area.

11. The sputter deposition source of claim 6, further comprising:

a first shield positioned between the at least one magnetron sputter cathode and the deposition area, and a second shield positioned between the second magnetron sputter cathode and the deposition area, such that a deposition window is arranged between the first shield and the second shield.

12. The sputter deposition source of claim 1, wherein magnet assemblies of two adjacent magnetron sputter cathodes of the array are arranged asymmetrically with respect to each other.

13. The sputter deposition source of claim 1, the array further comprising:

a first end cathode provided at a first end of the array and comprising a third magnet assembly for generating a closed plasma racetrack that extends on a single side of the first end cathode, the array optionally further comprising:

a second end cathode provided at a second end of the array and comprising a fourth magnet assembly for generating a closed plasma racetrack that extends on a single side of the second end cathode.

14. A magnetron sputter cathode, comprising:
a rotary target that is rotatable around a rotation axis; and
a magnet assembly that is arranged in the rotary target and comprises:
 a first magnet having a first-polarity magnet pole directed radially outwardly; and
 a second magnet having a second-polarity magnet pole directed radially outwardly, wherein the first magnet and the second magnet extend adjacent to each other along a closed path for generating a closed plasma racetrack on a surface of the rotary target with a first plasma confinement region extending parallel to the rotation axis on a first side of the magnetron sputter cathode and a second plasma confinement region extending parallel to the rotation axis on a second side of the magnetron sputter cathode opposite to the first side so that the first plasma confinement region and the second plasma confinement region are on opposite sides of the magnetron sputter cathode and face in two different directions that enclose, with respect to the first rotation axis, a first angle of 180°, and the closed plasma racetrack further comprises:
 a first curved plasma confinement region that connects the first plasma confinement region and the second plasma confinement region at a first axial end portion of the magnetron sputter cathode; and
 a second curved plasma confinement region that connects the first plasma confinement region and the second plasma confinement region at a second axial end portion of the magnetron sputter cathode.

15. A magnetron sputter cathode, comprising:
a rotary target that is rotatable around a rotation axis; and
a magnet assembly that is arranged in the rotary target and comprises:
 a first magnet having a first-polarity magnet pole directed radially outwardly; and
 a second magnet having a second-polarity magnet pole directed radially outwardly,
 wherein the first magnet and the second magnet extend adjacent to each other along a closed path for generating a closed plasma racetrack on a surface of the rotary target with a first plasma confinement region extending parallel to the rotation axis on a first side of the magnetron sputter cathode and a second plasma confinement region extending parallel to the rotation axis on a second side of the magnetron sputter cathode opposite to the first side so that the first plasma confinement region and the second plasma confinement region are on opposite sides of the magnetron sputter cathode and face in two different directions that enclose, with respect to the first rotation axis, a first angle of 180°, and the closed plasma racetrack is a dual side single racetrack that does not include any dual racetracks with two parallel plasma confinement regions on a same side of the magnetron sputter cathode.

16. A method of depositing a material on a substrate, the method comprising:
sputtering the material from at least one magnetron sputter cathode having a first magnet assembly arranged in a first rotary target that rotates around a first rotation axis,
wherein the first magnet assembly provides a closed plasma racetrack on a surface of the first rotary target with a first plasma confinement region extending parallel to the first rotation axis on a first side of the at least one magnetron sputter cathode and a second plasma confinement region extending parallel to the first rotation axis on a second side of the at least one magnetron sputter cathode opposite to the first side so that the first plasma confinement region and the second plasma confinement region are on opposite sides of the at least one magnetron sputter cathode and face in two different directions that enclose, with respect to the first rotation axis, a first angle of 180°, and wherein the closed plasma racetrack further comprises:
- a first curved plasma confinement region that connects the first plasma confinement region and the second plasma confinement region at a first axial end portion of the at least one magnetron sputter cathode; and
- a second curved plasma confinement region that connects the first plasma confinement region and the second plasma confinement region at a second axial end portion of the at least one magnetron sputter cathode.

17. The method of claim 16, wherein the first side and the second side are two opposite sides of the at least one magnetron sputter cathode, the first side facing toward a first adjacent magnetron sputter cathode and the second side facing toward a second adjacent magnetron sputter cathode.

18. The method of claim 16, wherein the material deposited on the substrate forms a transparent conductive oxide film.

19. The method of claim 16, wherein the material deposited on the substrate comprises at least one of: IZO, ITO, IGZO and Ag.

* * * * *